(12) United States Patent
Pyi

(10) Patent No.: US 6,841,461 B2
(45) Date of Patent: Jan. 11, 2005

(54) METHOD FOR FORMING GATE ELECTRODE OF SEMICONDUCTOR DEVICE

(75) Inventor: Seung Ho Pyi, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/701,327

(22) Filed: Nov. 4, 2003

(65) Prior Publication Data

US 2004/0203222 A1 Oct. 14, 2004

(30) Foreign Application Priority Data

Apr. 14, 2003 (KR) ............................ 10-2003-0023492

(51) Int. Cl.[7] .......................................... H01L 21/3205
(52) U.S. Cl. ...................... 438/585; 438/587; 438/592; 438/595
(58) Field of Search ................................ 438/585, 586, 438/587, 588, 589, 590, 591, 592, 593, 594, 595, 596

(56) References Cited

U.S. PATENT DOCUMENTS

| | | | | |
|---|---|---|---|---|
| 6,075,274 A | * | 6/2000 | Wu et al. ..................... | 438/595 |
| 6,136,678 A | * | 10/2000 | Adetutu et al. ............. | 438/592 |
| 6,255,206 B1 | * | 7/2001 | Jang et al. .................. | 438/595 |
| 6,277,722 B1 | * | 8/2001 | Lee et al. .................... | 438/592 |
| 6,291,307 B1 | | 9/2001 | Chu et al. | |
| 6,465,312 B1 | | 10/2002 | Yu | |
| 6,506,653 B1 | | 1/2003 | Furukawa et al. | |
| 6,528,404 B2 | * | 3/2003 | Kim ........................... | 438/596 |
| 6,555,450 B2 | | 4/2003 | Park et al. | |
| 6,596,598 B1 | | 7/2003 | Krivokapic et al. | |
| 6,674,137 B2 | * | 1/2004 | Nissa .......................... | 257/408 |
| 6,770,538 B2 | * | 8/2004 | Li et al. ...................... | 438/297 |
| 6,777,279 B2 | * | 8/2004 | Hashimoto et al. ......... | 438/585 |

FOREIGN PATENT DOCUMENTS

JP            4162519        6/1992

* cited by examiner

*Primary Examiner*—Kevin M. Picardat
(74) *Attorney, Agent, or Firm*—Ladas & Parry LLP

(57) ABSTRACT

Disclosed is a method for a gate electrode of a semiconductor device, which forms a re-oxidation film of a sufficient thickness by a low temperature re-oxidation process. Gate oxide film, doped-silicon film, tungsten nitride film, tungsten film, and hard mask film are sequentially formed on semiconductor substrate. Hard mask film is patterned. Tungsten film and tungsten nitride film are etched using patterned hard mask film as an etching barrier in order to expose doped-silicon film. Predetermined oxidation-accelerating ions are implanted into a portion and a side of exposed doped-silicon film. A portion of exposed doped-silicon film is etched. Substrate resulting object is re-oxidized to form a re-oxidation film at a side of etched doped-silicon film.

6 Claims, 5 Drawing Sheets

METHOD FOR FORMING GATE ELECTRODE OF SEMICONDUCTOR DEVICE

BACKGROUND OF THE INVENTION

1. Field of the Invention

The present invention relates to a method for forming a gate electrode of a semiconductor device, and more particularly to a method for a gate electrode of a semiconductor device which forms a re-oxidation film of a sufficient thickness, using a low temperature re-oxidation process, in order to prevent an interface phase from being formed between a tungsten nitride film and a doped-silicon film for the gate electrode.

2. Description of the Prior Art

As generally known in the art, the width of gate electrodes is becoming smaller as semiconductor devices become more integrated. As the width of conductors becomes narrower, the resistance of the conductors becomes greater. In the same manner, as the width of gate electrodes becomes narrower, the resistance thereof becomes greater.

Recently, a tungsten silicide WSix is used as the gate electrode. Various attempts to extend the usage of the tungsten silicide have been made.

However, since all devices require a high-speed characteristic, the resistance of the gate electrode should be adjusted to be lower.

Accordingly, as a substitution for the tungsten silicide WSix using for the gate electrode material, manufacturers of such devices have proposed a laminate structure of tungsten film W/tungsten nitride film WN/doped-silicon film. It is expected to be used for most gate electrodes.

In the laminate structure, when only the tungsten film and the doped-silicon film are laminated, a reaction occurs at the interface between the tungsten film and the doped-silicon film to form an undesirable tungsten silicide. In order to prevent the occurrence of the reaction at the interface therebetween, a tungsten nitride film is embedded between the tungsten film and the doped-silicon film as a reaction inhibiting material. A small quantity of silicon nitride film is formed at a high temperature at the interface between the tungsten film for the reaction inhibiting material and the doped-silicon film.

After the gate electrode is formed, conventionally, in order to remove damaged layers and a field concentration in a gate edge, a gate re-oxidation process is performed.

A conventional method for forming a gate electrode in a semiconductor device will now be described with reference to FIG. 1. FIG. 1 is a cross-sectional view showing a gate electrode in which a conventional gate re-oxidation process is performed.

After a gate oxide film 2, a polysilicon film 3 and a hard mask 4 for a gate electrode are sequentially laminated on a silicon substrate 1, and the resulting object is etched to form a gate electrode 5. A gate re-oxidation process for the substrate resulting object is performed to oxidize a sidewall of an exposed gate electrode by a predetermined thickness, so that a re-oxidation film 6 is formed at a sidewall of the gate electrode 5.

Due to the re-oxidation film 6, damaged layers of the gate electrode 5 are removed, and thereafter the field concentration in the gate edge is removed.

When forming the gate re-oxidation process, a dry oxidation process is not performed in the gate electrode 5 on which the tungsten film W/tungsten nitride film WN/doped-silicon film are laminated due to an abnormal oxidation of the tungsten film. Thus, a wet oxidation process to uniform a rate of hydrogen and oxygen is performed at a high temperature higher than 1000° C.

However, when the low temperature gate re-oxidation process is performed, the interface between a tungsten nitride film and a doped-silicon film for a gate electrode is formed, thus lowering a characteristic of the gate electrode. In order to prevent that, when the gate re-oxidation process is performed at a lower temperature, a re-oxidation film of a sufficient thickness is not formed at a sidewall of the gate electrode not to remove damaged layers of the gate electrode and a field concentration in a gate edge.

SUMMARY OF THE INVENTION

Accordingly, the present invention has been made to solve the above-mentioned problems occurring in the prior art, and an object of the present invention is to provide a method for a gate electrode of a semiconductor device, which forms a re-oxidation film of a sufficient thickness using a low temperature re-oxidation process.

Another object of the present invention is to provide a method for a gate electrode of a semiconductor device, which prevents a field concentration in a gate edge by forming an oxide film of a sufficient thickness at a sidewall of the gate electrode.

A further object of the present invention is to provide a method for a gate electrode of a semiconductor device, which prevents an interface phase from being formed between a tungsten nitride film and a doped-silicon film for a gate electrode by performing a low temperature gate re-oxidation process.

In order to accomplish this object, there is provided a method for forming a gate electrode of a semiconductor device, the method comprising the steps: i) sequentially forming a gate oxide film, a doped-silicon film, a tungsten nitride film, a tungsten film, and a hard mask film on a semiconductor substrate; ii) patterning the hard mask film; iii) etching the tungsten film and the tungsten nitride film using the patterned hard mask film as an etching barrier in order to expose the doped-silicon film; iv) implanting predetermined oxidation-accelerating ions into a portion of the exposed doped-silicon film; v) etching the exposed doped-silicon film; and vi) re-oxidizing the substrate resulting object to form a re-oxidation film at a side of the etched doped-silicon film.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
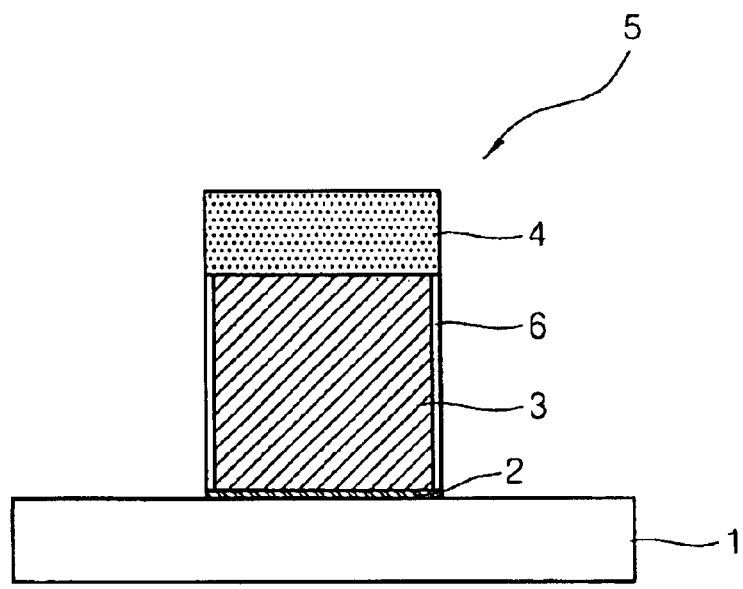
FIG. 1 is a cross-sectional view showing a gate electrode in which a conventional gate re-oxidation process is performed.

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 2A through 2G are cross-sectional views which illustrate a method for forming a gate electrode of a semiconductor device according to an embodiment of the present invention.

Figure 2A:
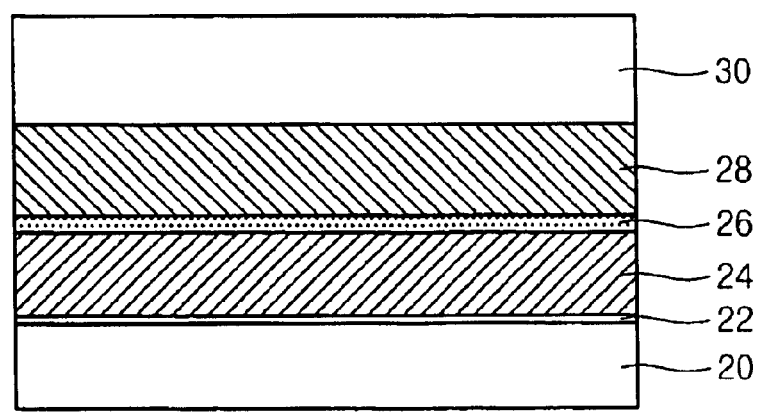
FIGS. 2A through 2G are cross-sectional views which illustrate a method for forming a gate electrode of a semiconductor device according to an embodiment of the present invention.

Referring to FIG. 2A, a gate oxide film 22, a doped-silicon film 24, a tungsten nitride film 26, a tungsten film 28, and a hard mask film 30 are formed sequentially on a semiconductor substrate 20.

When the gate electrode is patterned, the hard mask film 30 functions as an etching barrier. When a contact is formed, the hard mask film is used to prevent an electric short-circuiting. As a substitute of the hard mask film 30, an oxide film, a nitride film, or a combination thereof is used.

Figure 2B:
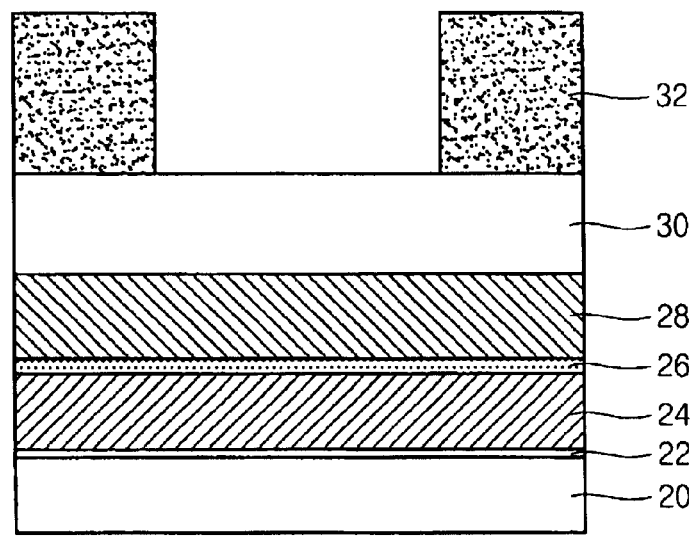

Referring FIG. 2B, a resist layer is coated on the hard mask film 30, and a resulting object is exposed to light and developed to form a resist pattern 32. The resist pattern 30 defines a gate electrode-forming region.

Figure 2C:
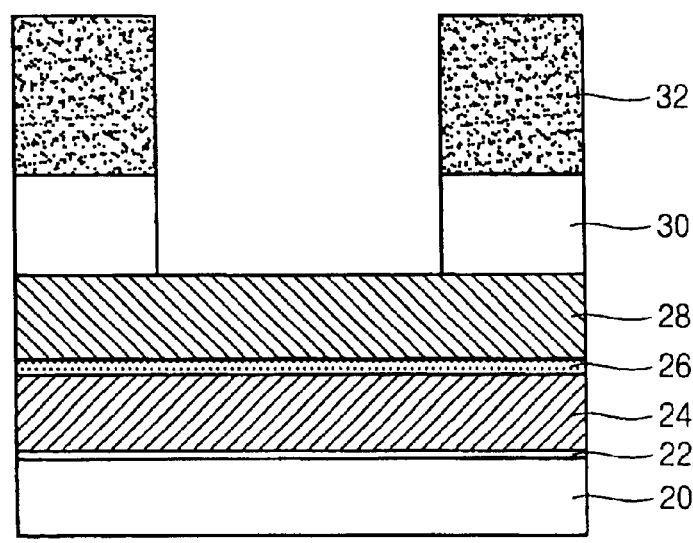

With reference to FIG. 2C, the hard mask film 30 is dry etched by using the resist pattern 32 as an etching barrier.

Figure 2D:
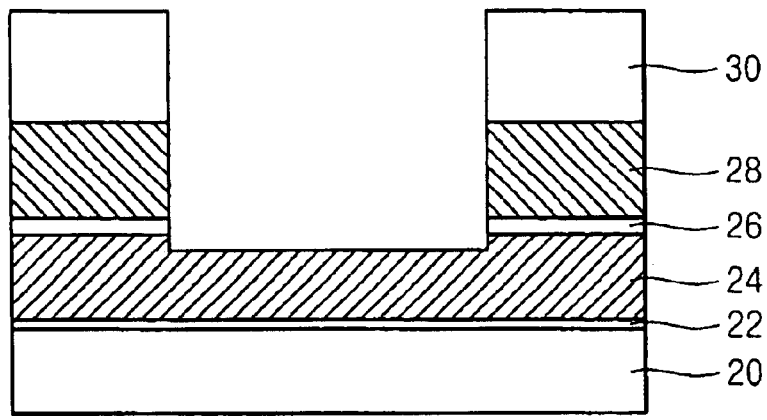

With reference to FIG. 2D, after the resist pattern 32 is removed, the tungsten film 28 and the tungsten nitride film 26 are dry etched by using the etched hard mask film 30 as an etching barrier, so that the doped-silicon film 23 formed at a lower portion of the tungsten nitride film 26 is exposed. At this time, a surface of the doped-silicon film 24 may be partially etched to a predetermined thickness.

Figure 2E:
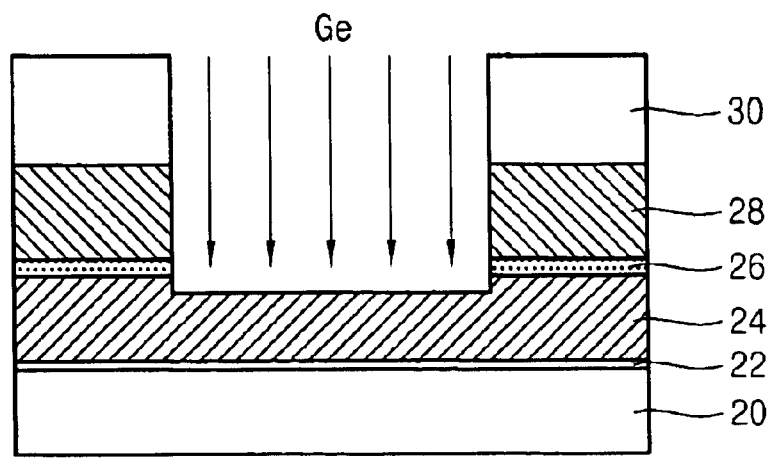

Referring to FIG. 2E, predetermined oxidation-accelerating ions are implanted into a portion of the exposed doped-silicon film 20 and a side of the exposed doped-silicon film 20. The predetermined oxidation-accelerating ions have no effect on the portion of the exposed doped-silicon film 20 and the side of the exposed doped-silicon film 20. Preferably, in an embodiment of the present invention, the predetermined oxidation-accelerating ions includes Ge.

The ion implantation energy of Ge has a range between 20 to 200 KeV. The ion implantation of the Ge has a projecting range Rp of ±500 Å of a thickness of a remaining doped-silicon film. An ion implantation angle of the ion implantation has a range of 0 to 10°. For example, when the ion implantation energy of Ge is 30 KeV, the projecting range Rp of the ion implantation is 300 Å. When the ion implantation energy of Ge is 200 KeV, the projecting range Rp of the ion implantation is 1500 Å.

Figure 3:
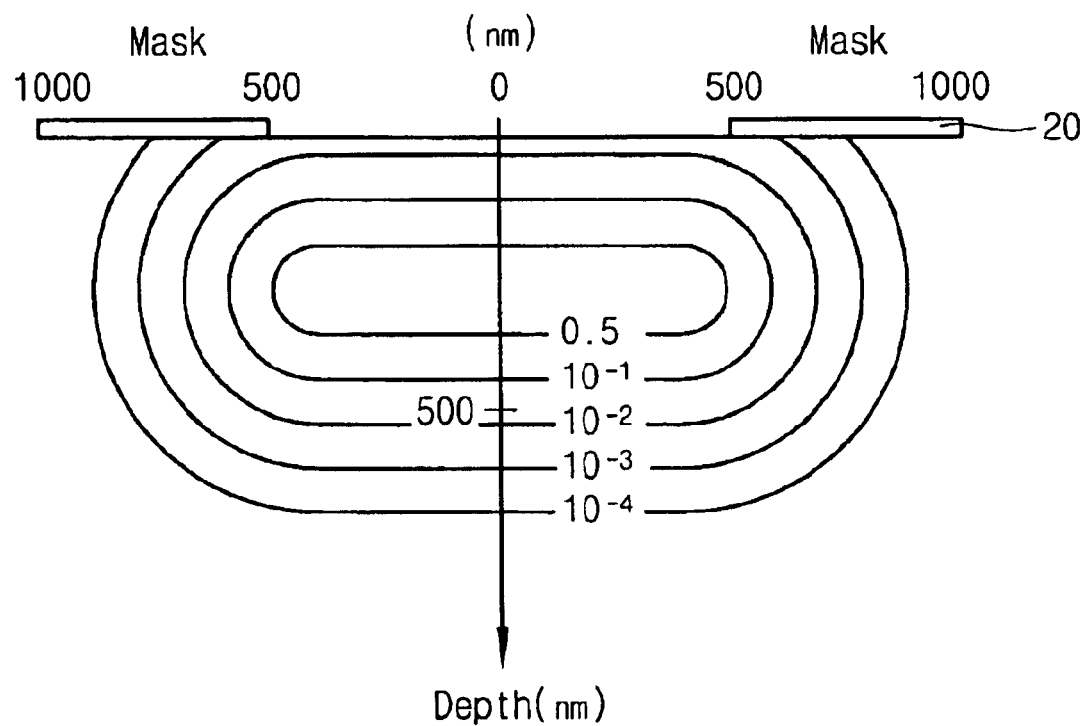
FIG. 3 is a view showing a distribution of ions implanted into a side of a hard mask during an ion implantation process of FIG. 2E.

At this time, the oxidation-accelerating ion is implanted perpendicularly to the exposed doped-silicon film 24. However, as shown in FIG. 3, the oxidation-accelerating ion can be also implanted into a side of the hard mask film 30.

After the oxidation-accelerating ion is implanted to the side of the hard mask film 30, it is implanted into a side and a depth direction of the doped-silicon film 24.

Accordingly, a re-oxidation film of a sufficient thickness is formed by a low temperature gate re-oxidation process at the side of the doped-silicon film 24 to which the oxidation-accelerating ion is implanted.

Due to the ion implantation, an ion is implanted into the silicon substrate on which a source/drain region will be formed. When the implanted ion has a great weight, the ion causes a surface region of the silicon substrate 20 to be amorphized, thus easily forming a thin junction.

Figure 2F:
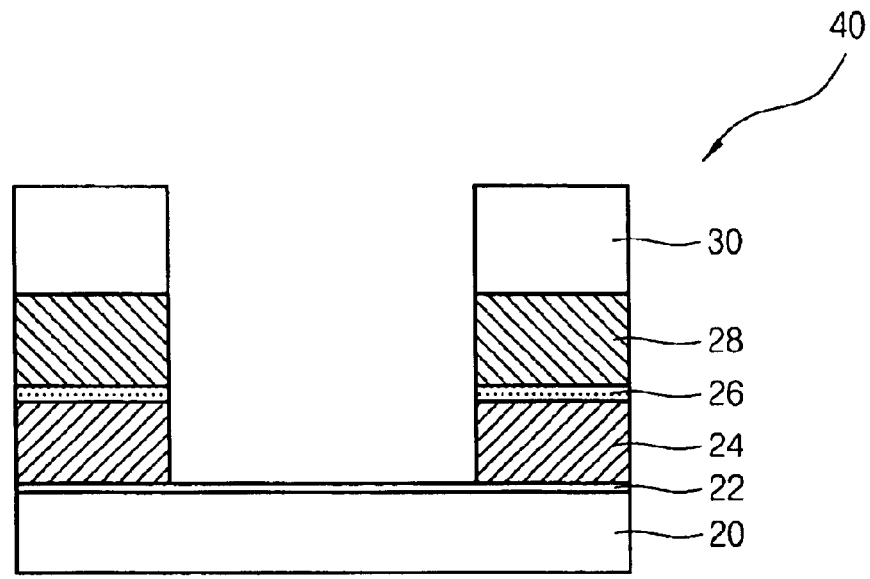

Referring to FIG. 2F, the exposed doped-silicon film 24 is dry etched to form a gate electrode 40 on which the tungsten film/tungsten nitride film/doped-silicon film are laminated.

Figure 2G:
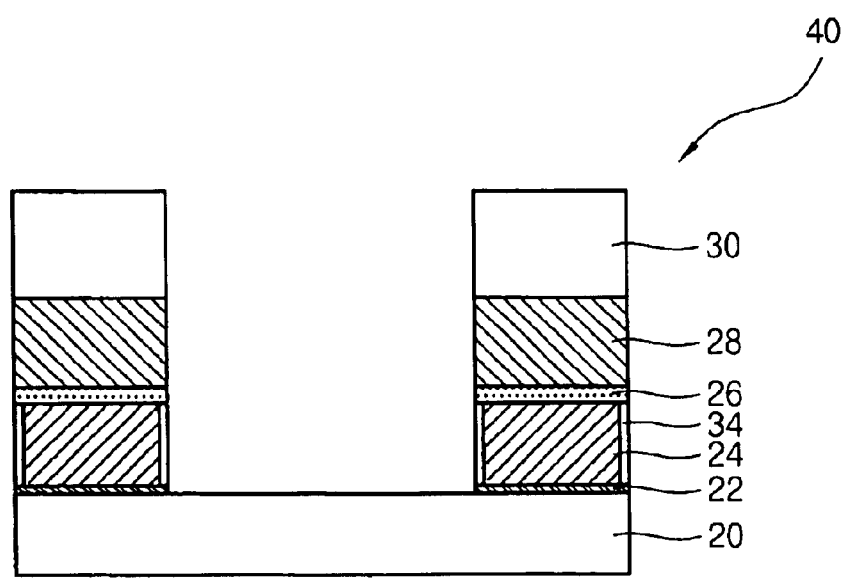

With reference to FIG. 2G, in order to remove layers damaged during the dry etching process and a field concentration in a gate edge, a re-oxidation process for the substrate resulting object is performed to form a re-oxidation film 34 at a sidewall of the gate electrode 40, more exactly, a sidewall of an exposed doped-silicon film 24. The gate re-oxidation process is performed at a wet atmosphere only to oxidize a doped-silicon film 24 but not to oxidize the tungsten film 28 and a tungsten nitride film 26. In particular, the gate re-oxidation process is performed at a lower temperature less than 1000° C. which prevent a phase from being occurred at an interface between the tungsten nitride film 26 and the doped-silicon film 24.

As indicated above, since the oxidation-accelerating ion is implanted into the side of the etched doped-silicon film 24, a re-oxidation film 34 of a sufficient thickness is formed at the side of the gate electrode 40 using a low temperature re-oxidation process at a temperature less than 1000° C.

Preferably, the gate re-oxidation process is implemented in a manner such that $O_2$ gas and $H_2$ gas flow to effect reaction as defined in the reaction formula $2H_2+O_2=2H_2O$, under a condition for allowing the ratio between the remaining $H_2$ gas and $H_2O$ produced by this reaction, as designated by $H_2O/H_2$, to become 0.1~0.5, and at a pressure of 760 Torr and a temperature of no greater than 1000° C.

Accordingly, the present invention forms a re-oxidation film 34 of a sufficient thickness by a low temperature re-oxidation process. Since the re-oxidation process is performed at a low temperature, during the re-oxidation process, the present invention prevents an interface phase from being formed between the tungsten nitride film 26 and the doped-silicon film 24.

As mentioned above, since the present invention performs the gate electrode re-oxidation process at a low temperature, it prevents an undesirable interface phase from being formed between a tungsten nitride film and a doped-silicon film laminated for a gate electrode. Thus, gate feature deterioration such as the occurrence of a signal error is prevented.

Since the present invention forms a re-oxidation film at a sidewall of the gate electrode, a field concentration in a gate edge is prevented. It prevents a signal channel effect and a degradation of a gate oxide film due to a hot carrier, thereby improving the reliability of a device.

Furthermore, since the present invention implants an ion having a great weight into a silicon substrate while adjusting an implantation energy of the ion during an additional ion implantation, the ion causes a surface region of the silicon substrate to be amorphized prior to an ion implantation of source/drain, thus easily forming a thin junction.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a gate electrode of a semiconductor device, the method comprising the steps:

i) forming a gate oxide film, a doped-silicon film, a tungsten nitride film, a tungsten film, and a hard mask film sequentially on a semiconductor substrate;

ii) patterning the hard mask film;

iii) etching the tungsten film and the tungsten nitride film using the patterned hard mask film as an etching barrier in order to expose the doped-silicon film;

iv) implanting predetermined oxidation-accelerating ions into a portion of the exposed doped-silicon film;

v) etching the exposed doped-silicon film; and vi) re-oxidizing the substrate resulting object to form a re-oxidation film at a side of the etched doped-silicon film.

2. A method as claimed in claim 1, wherein the predetermined oxidation-accelerating ion includes Ge.

3. A method as claimed in claim 1, wherein step iv) is performed by an energy between 20 to 200 KeV.

4. A method as claimed in claim 1, wherein the ion implantation in step iv) has a projecting range of ±500 Å of a thickness of the exposed doped-silicon film portion.

5. A method as claimed in claim 1, wherein an ion implantation angle of the ion implantation in step iv) has a range of 0 to 10°.

6. A method as claimed in claim 1, wherein step v) is performed at a temperature less than or equal to 1000° C.

* * * * *